United States Patent Office 2,785,096

Patented Mar. 12, 1957

2,785,096

MANUFACTURE OF JUNCTION-CONTAINING SILICON CRYSTALS

Willis A. Adcock, Dallas, Tex., assignor to Texas Instruments Incorporated, Dallas, Tex., a corporation of Delaware No Drawing. Application May 25, 1955, Serial No. 511,111

4 Claims. (Cl. 148—1.5)

This invention relates to the manufacture of silicon crystals for use in electrical devices such as transistors and crystal diodes, and particularly to the manufacture of said crystals in such a manner that they will contain a p-i-n junction, that is to say, a layer of p-type conductivity material separated from a layer of n-type conductivity material by a layer of material of intrinsic characteristics.

The formation of semiconductor junctions of the n-p-i-n type and the p-n-i-p type has been suggested by J. M. Early (Bell System Technical Journal, 33, 517 (1954)). The presence of an intrinsic layer between a layer of p-type conductivity and a layer of n-type conductivity reduces the electrical capacity between these two layers, and thus tends to improve the frequency characteristics of the device, especially in transistors where the intrinsic layer is between the base layer and the collector.

The manufacture of such crystals is quite difficult because of the difficulty of controlling the conductivity-affecting impurity levels accurately enough to reach an exact state of balance, thus to form an intrinsic layer. This invention relates to a method that will expediently accomplish the production of silicon crystals containing a p-i-n junction. Ordinarily, these crystals will contain an n-p-i-n junction or a p-i-n-p junction when they are to be used in transistors, but they contain simply a p-i-n junction for use in crystal diodes, if so desired.

Briefly, the present invention comprises growing a silicon crystal from a molten bath, in accordance with known practices, and controlling the crystal conductivity type and resistivity either by doping or growth rate control, or otherwise, so as to produce in the crystal a layer of silicon of n-type conductivity, a layer of silicon of p-type conductivity, and an intermediate layer of silicon that is but slightly of p-type conductivity. This crystal is thereafter heat-treated at a sufficiently high temperature and for a sufficient length of time to convert the intermediate layer to an intrinsic layer.

It has been discovered, in accordance with the principles of this invention, that prolonged heating of a body of silicon of p-type conductivity at a temperature of around 300° C. to 450° C. will tend to change this body of silicon to n-type conductivity. The change takes place slowly, and this furnishes ample opportunity to stop the conversion at the time when what was originally a weakly p-type conductivity layer reaches the intrinsic state.

Further advantages and further details of this invention will be apparent from the following detailed description of the practice of this invention in its preferred form.

To prove the fact that conductivity type could be changed by heating, a crystal was grown from 50 grams of silicon which was melted in a crystal-pulling machine. This original material was of n-type conductivity and had a resistivity of approximately 8 ohm-centimeters. After about half of the molten silicon had been solidified into crystal, 1.6 milligrams of aluminum was added. After an additional 0.004 inch of crystal had grown, 7.5 milligrams more aluminum was added. After another 0.005 inch of crystal had grown, 100 milligrams of pure arsenic was added, and the remainder of the crystal permitted to grow. As a result of this process a crystal was produced which had two large n-type conductivity sections, one at each end, and these were separated by two p-type conductivity layers, the first of which was of weakly p-type conductivity, and the second of which was much more strongly p-type conductivity. The resistivity of the first p layer was 5.0 ohm-centimeters and that of the second p layer 0.7 ohm-centimeters. That of the last n layer was 0.003 ohm-centimeters.

This crystal was heated in an electric oven at 360° C. for nine and one-half hours. At the end of this time, electrical tests showed a marked decrease in base width, thus indicating that the weaker p-type conductivity layer had been converted into n-type material.

By repeating this operation and reducing the period of heating to 3 hours, it was found to be possible to lower the capacity between the p and n layers on opposite sides of the intermediate layer from about 9 micromicrofarads, for a normal size transistor section, to about 1 micromicrofarad. This indicated clearly the conversion of the weak p layer to an intrinsic layer. The resultant transistor was usable at frequencies in the range of 35 to 40 megacycles, as compared with 5 to 7 megacycles for a similar transistor with no intrinsic layer.

The indications are that if the weak p layer has a resistivity that is greater than 1.5 ohm-centimeters, it will be possible to raise the p region into the intrinsic range by prolonged heating at a temperature of around 300° C. to 450° C.

Although the present invention has been shown and described in terms of a single preferred embodiment, nevertheless various changes and modifications, obvious to one skilled in the art, are within the spirit, scope and contemplation of the invention.

What is claimed is:

1. A method of manufacturing silicon crystals for use in transistors, crystal diodes and the like that comprises growing a silicon crystal from a molten bath under conditions which will produce a first layer of silicon having n-type conductivity, a second layer of silicon having p-type conductivity and having a resistivity of at least about 1.5 ohm-centimeters, and a third layer of silicon having the same kind of conductivity as the second layer, but having a resistivity substantially lower than the second layer, and subsequently heating the crystal containing the three layers at a temperature of from 300° C. to 450° C. and for a period of time sufficient to effect the conversion of the second layer of silicon to an intrinsic state having a substantially higher resistivity than it originally had.

2. A method of manufacturing silicon crystals for use in transistors, crystal diodes and the like that comprises growing a silicon crystal from a molten bath under conditions which will produce a first layer of silicon having n-type conductivity, and a second layer of silicon having p-type conductivity and having a resistivity of at least about 1.5 ohm-centimeters, a third layer of silicon having the same kind of conductivity as the second layer but having a resistivity substantially lower than the second layer, and a fourth layer of silicon having the same kind of conductivity as the first layer and subsequently heating the crystal containing the four layers at a temperature of from 300° C. to 450° C. and for a period of time sufficient to effect the conversion of the second layer of silicon to an intrinsic state having a substantially higher resistivity than it originally had.

3. A method of manufacturing silicon crystals for use in transistors, crystal diodes and the like which includes the steps of forming a silicon crystal under conditions which will produce a first layer of silicon having n-type conductivity, a second layer of silicon having p-type of conductivity and having a resistivity of at least about 1.5 ohm-centimeters, and a third layer of silicon having the same kind of conductivity as the second layer, but having a resistivity substantially lower than the second layer, and subsequently heating the crystal containing the three layers at a temperature of from 300° C. to 450° C. and for a period of time sufficient to effect the conversion of the second layer of silicon to an intrinsic state having a substantially higher resistivity than it originally had.

4. A method of manufacturing silicon crystals for use in transistors, crystal diodes and the like which includes the steps of forming a silicon crystal under conditions which will produce a first layer of silicon having n-type conductivity, and a second layer of silicon having p-type conductivity and having a resistivity of at least about 1.5 ohm-centimeters, a third layer of silicon having the same kind of conductivity as the second layer but having a resistivity substantially lower than the second layer, and a fourth layer of silicon having the same kind of conductivity as the first layer and subsequently heating the crystal containing the four layers at a temperature of from 300° C. to 450° C. and for a period of time sufficient to effect the conversion of the second layer of silicon to an intrinsic state having a substantially higher resistivity than it originally had.

References Cited in the file of this patent

UNITED STATES PATENTS

| | | |
|---|---|---|
| 2,602,763 | Scaff et al. | July 8, 1952 |
| 2,701,326 | Pfann et al. | Feb. 1, 1955 |